(12) United States Patent
Trushin et al.

(10) Patent No.: US 9,051,780 B2
(45) Date of Patent: Jun. 9, 2015

(54) PROGRESSIVE CAVITY HYDRAULIC MACHINE

(75) Inventors: Alexander S. Trushin, Katy, TX (US); Jacques Orban, Cheltenham (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 1184 days.

(21) Appl. No.: 12/920,592

(22) PCT Filed: Jan. 9, 2008

(86) PCT No.: PCT/US2008/000302
§ 371 (c)(1),
(2), (4) Date: Nov. 11, 2010

(87) PCT Pub. No.: WO2009/139658
PCT Pub. Date: Nov. 19, 2009

(65) Prior Publication Data
US 2011/0150686 A1 Jun. 23, 2011

(51) Int. Cl.
| F01C 1/10 | (2006.01) |
| E21B 4/02 | (2006.01) |
| F01C 1/107 | (2006.01) |
| F04C 13/00 | (2006.01) |
| H01S 5/30 | (2006.01) |
| H01S 5/323 | (2006.01) |

(52) U.S. Cl.
CPC . *E21B 4/02* (2013.01); *F01C 1/107* (2013.01); *F04C 13/008* (2013.01); *F04C 2230/91* (2013.01); *F04C 2240/20* (2013.01); *F04C 2240/70* (2013.01); *H01S 5/305* (2013.01); *H01S 5/32341* (2013.01)

(58) Field of Classification Search
CPC .......... E21B 4/02; F04C 13/008; A61G 15/16
USPC ........................ 418/178, 155, 154, 179, 201.1
See application file for complete search history.

(56) References Cited

U.S. PATENT DOCUMENTS

| 945,067 | A | * | 1/1910 | Wheeler | 418/190 |
| 5,722,820 | A | * | 3/1998 | Wild et al. | 418/48 |
| 6,241,494 | B1 | * | 6/2001 | Pafitis et al. | 418/48 |
| 6,336,796 | B1 | * | 1/2002 | Cholet et al. | 418/48 |
| 6,371,206 | B1 | | 4/2002 | Mills | |
| 8,523,545 | B2 | * | 9/2013 | Wilbourn et al. | 418/50 |

(Continued)

FOREIGN PATENT DOCUMENTS

| JP | 2003042075 A | 2/2003 |
| RU | 2318134 C2 | 2/2008 |

(Continued)

OTHER PUBLICATIONS

M.B. Dusseault, S. El-Sayed, "Heavy-Oil Production Enhancement by Encouraging Sand Production," SPE59276, 2000 SPE/DOE Improved Oil Recovery Symposium, Tulsa, Oklahoma Apr. 3-5, 2000, pp. 1-12.

(Continued)

*Primary Examiner* — Kenneth Bomberg
*Assistant Examiner* — Anthony Ayala Delgado
(74) *Attorney, Agent, or Firm* — Michael Stonebrook; Brandon Clark (57) ABSTRACT

This invention relates to machine-building, more specifically, to the design and manufacturing of positive displacement motors various embodiments of which are used for hydrocarbon production.

12 Claims, 6 Drawing Sheets

(56) References Cited

U.S. PATENT DOCUMENTS

| | | | |
|---|---|---|---|
| 8,672,656 B2* | 3/2014 | Guidry, Jr. | 418/178 |
| 2005/0169779 A1* | 8/2005 | Bratu | 417/410.4 |
| 2007/0172371 A1 | 7/2007 | Podmore | |
| 2008/0304992 A1* | 12/2008 | Hooper et al. | 418/48 |
| 2009/0074599 A1* | 3/2009 | Tekneyan et al. | 418/48 |

FOREIGN PATENT DOCUMENTS

| | | |
|---|---|---|
| RU | 2388894 C1 | 5/2010 |
| SU | 1430491 | 10/1988 |
| WO | 99/27254 | 6/1999 |

OTHER PUBLICATIONS

W. Tiraspolsky, Hydraulic Downhole Drilling Motors, Editions Technip, Paris, 1985.

PowerPack Steerable Motor Handbook, Schlumberger, 2004.

International Search Report and Written Opinion issued in PCT/RU2008/000302 on Feb. 19, 2009, 6 pages.

Office Action issued in RU2010151623 on Mar. 21, 2012, 11 pages.

Decision on Grant issued in RU2010151623 on Aug. 2, 2012, 8 pages.

Examination Report issued in CA2719121 on Jul. 28, 2014, 2 pages.

* cited by examiner

Fig. 1

(PRIOR ART)

PROGRESSIVE CAVITY HYDRAULIC MACHINE

This invention relates to machine-building, more specifically, to the design and manufacturing of positive displacement hydraulic rotary machine; various embodiments of which are used for oil-field (wells) applications.

Positive displacement motor (PDM) is commonly used for directional drilling operations throughout the world and progressive cavity pump (PCP) having a similar design is widely used in artificial lift. These machines are often referred to MOYNO system, in reference of to the main initial business application of such machines.

For such system, reliable and steady operation is essential over long operating time. Typical life of a PDM in normal drilling conditions is usually accounted as half a month and may reduce to several hours in case of severe conditions while aggressive drilling. Deterioration rate of PCP pumps becomes serious in presence of high sand content or proppant flowback. Practice demonstrated that most failures of PDM and PCP are generated by the stator's elastomer. Elastomeric stators usually fail due to high mechanical loading, wearing due to erosion and abrasion, fluid incompatibility, high temperature. When operating at high differential pressure or with progressive erosion, internal leakage increases and the system performance is progressively reduced.

This invention is aimed to reduction of PDM/PCP performance degradation by introducing of a fixed positive clearance between the rotor and the stator and additional calibrated channels providing tolerable leakage of fluid between hydraulic chambers, allowing elastomeric coatings of the conventional system to be replaced by more resistant materials.

SLB patented [U.S. Pat. No. 6,241,494, Demosthenis G. Pafitis, 1998] and tested some hydraulic motors with non-elastomeric stator. This type of motor operates with a clearance estimated as 0.3-0.6 mm. With such construction, system plugging with large particles (such as LCM or Fluid Loss Materials) in some specific conditions (such as motor stall) must be solved for proper applications.

PRIOR ART

Helical hydraulic machines are widely used in oil and gas industries: the terminology MOYNO is often associated to some machine design.

One application of these devices is Positive Displacement Motors (PDM) when drilling mud is pumped to the drillstring for converting of flow energy into mechanical for driving the drilling bit. The performance of PDM depends on motor design, properties of drilling mud (density, viscosity), downhole environment condition (pressure, temperature, chemical composition of the fluid) and drilling regimes (required torque and weight on bit (WOB).

The second application of the same hydraulic operation principle is the Progressive Cavity Pump (PCP) for lifting of production fluids from the producing formation to the surface via the production tubing. For such application, the rotor can be driven by submersible electric motor downhole (for deep pump) or by a surface unit rotating a rod connected to the PCP rotor (the latter variant is suitable for moderate depth). A Progressive Cavity Pump has several advantages in comparison with other types of pumps: it consists of two main units (rotor and stator), so it is reliable in operation, provides a steady flow rate of pumped fluid, it has easy-controllable flow rate. It is widely used for pumping of heavy oil and other high-viscosity fluids even with a high percentage of sand in the fluid. Thanks to their high performance and reliability, PCP is commonly applied for heavy oil production.

Figure 1:
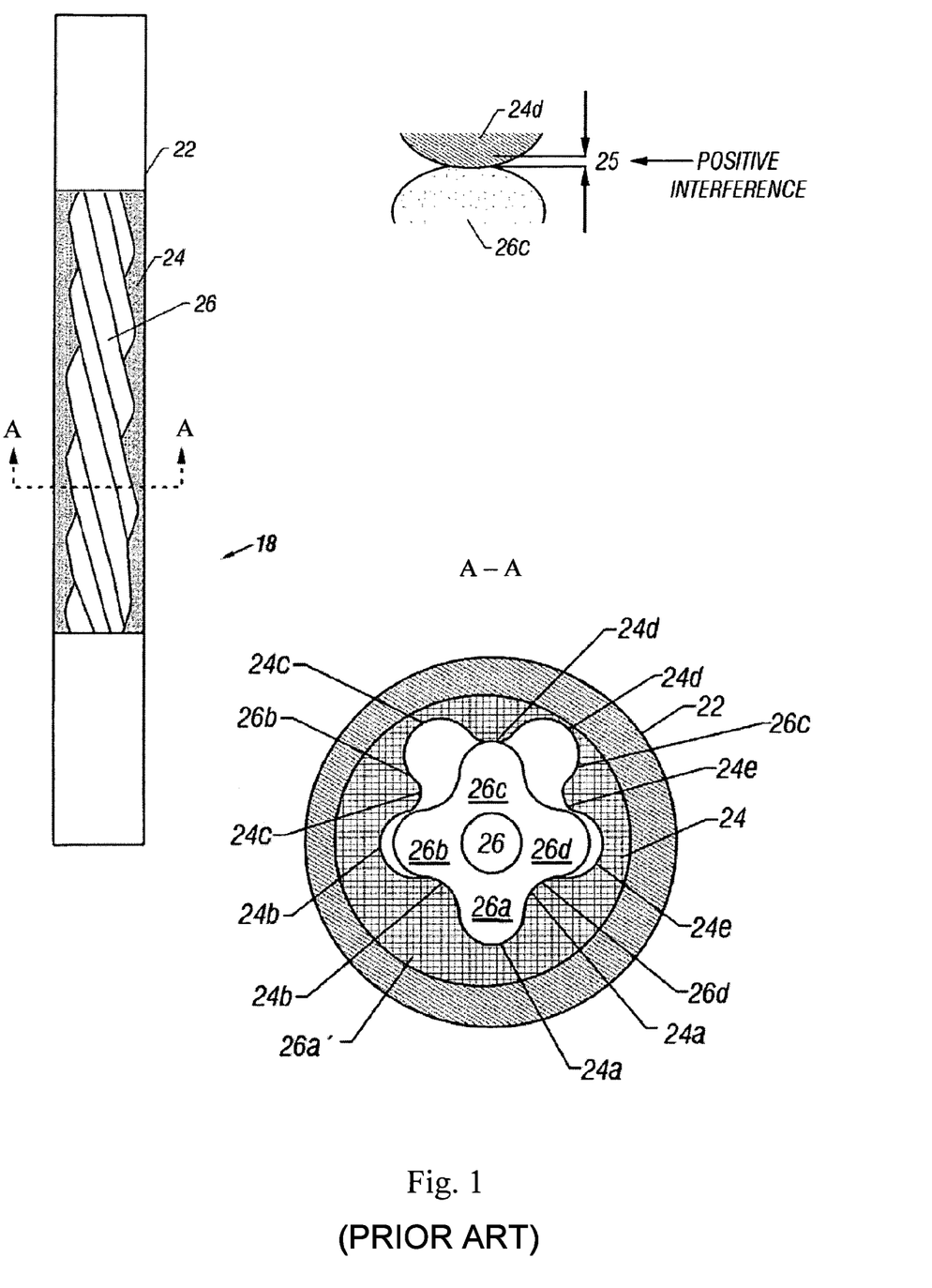
FIG. 1 is a cutaway view of motor/pump showing the rotor and the stator (left side).

Standard design of such hydraulic system (PDM and PCP) is a combination of a metallic rotor with a helical shape and a stator with inner surface covered with elastomer material providing a tight but flexible rotor-stator contact along the contact curve throughout the motor. FIG. 1 shows the details of the power section 18 of PDM/PCP. The power section 18 generally includes the housing 22 which houses the stator 24 within which a motor rotor 26 is rotationally mounted. The stator 24 has a plurality of helical lobes 24a-24e, which define the corresponding number of helical cavities 24a'-24e'. The rotor 26 has a plurality of helical lobes 26a-26d. This figure refers to a 4-lobe rotor. Such systems (PDM/PCP) are considered as positive displacement hydraulic machine: In the ideal case, the flow is proportional to rotation speed (RPM) while the torque is proportional to the differential pressure across the system.

However the current design of industrial PDM and PCP (or screw pumps) put limits on their application. Current design of industrial hydraulic machines for oil industry is based on a solid rotor (metal or composite) and a stator comprising of a metallic housing lined with elastomer material. The interference between the lobes of rotor and elastomeric stator at contact lines defines cavities for trapping fluid which is transported along the system axis from the intake to the outlet thanks to the machine rotation. For a positive displacement motor, hydraulic pressure difference between cavities defined by the helical stator and helical rotor drives the rotor in the proper direction. In case of PCP, the rotor rotation pushed the fluid across the pump, creating the delta pressure between successive chambers. It is commonly believed that the efficiency of such design depends on the tightness of contact (interference between 24d and 26c, see FIG. 1) between the stator and rotor along the helical-type contact curve [1]. This generates complex requirements onto the properties of elastomer. It must sustain differential pressure across the cavities to prevent leakages, while being flexible enough for tight contact, but strong enough to withstand wearing from the sliding of the rotor and erosion; It must also withstand thermal impact due to friction, chemical aging due to oil or hydrocarbon elements over wide temperature range in the well. As a consequence to these requirements, these elastomeric materials are expensive; they require special methods of depositing on the liner to make a stator for high geometrical precision after molding, including consideration of post-reaction settling and swelling.

The prior art for design of positive displacement hydraulic machine (especially drilling motors) assumes a strong positive seal called a positive interference. When higher downhole temperatures are anticipated, the positive interference is reduced during assembly to allow thermal expansion of the elastomer. The mud weight and vertical depth also must be considered as they influence the hydrostatic pressure applied to the stator's elastomer and cause it to shrink. Drilling motors (such as SLB Powerpack™) are commonly available with different stator elastomers. The choice of elastomer depends on the downhole conditions. However the conditions can vary during motor operation, so it is desirable to have a stator-rotor pair which is universal for standard and challenging conditions of temperature and pressure. The choice of interference can be predicted by various models: for example, the Schlumberger software called PowerFit is used to calculate the desired interference fit for a PowerPack™ Steerable Motor.

However by looking into typical performance curve of PDM (such as PowerPack™ Steerable Motor), it may be observed that considerable leakages exist in operational range of differential pressure. This means that part of the sealing lines become open during the operation allowing part of the flow to leak from cavity to cavity in place of moving with cavity rotation and translation.

Figure 2:
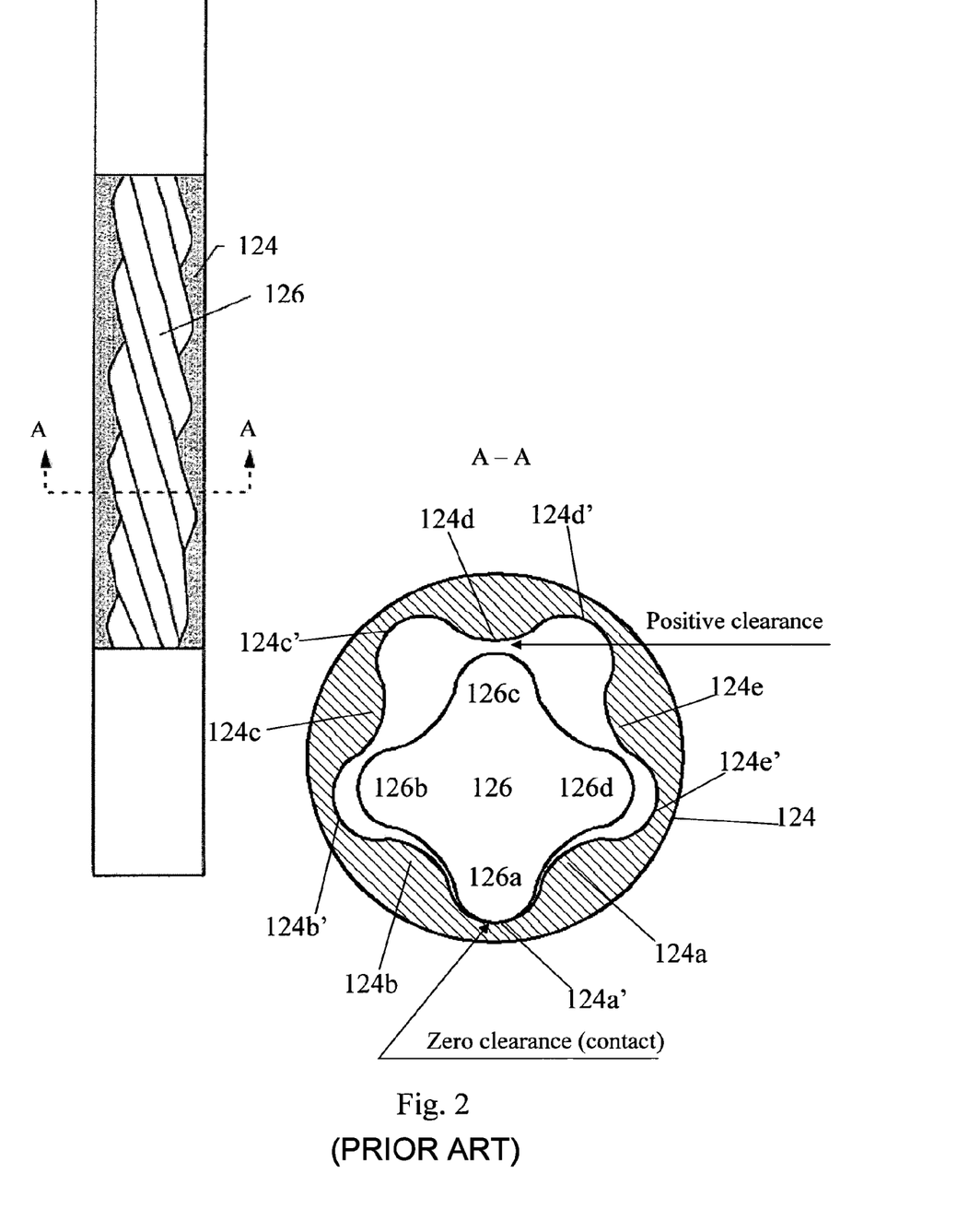
FIG. 2 shows another modification of prior art device with a positive clearance. The view is similar to FIG. 1.

An alternative method of using the stator-rotor pair with negative interference (or positive clearance) was, described in U.S. Pat. No. 6,241,494 (Demosthenis Pafitis et al., 2001). This patent teaches that a small clearance between the rotor and stator is quite tolerable for good performance of a hydraulic motor. FIG. 2 shows the concept of this design. There is a positive clearance between rotor's lobes 126b, 126c, 126d and the stator, but there is also at least one contact line between the rotor and the stator as it is shown between 126a and 124a'. During the rotation of the rotor it rolls over the stator and the contact line moves as well. This design was tested and showed acceptable performance. Positive clearance helps avoiding some problems: Fine particles pass trough the system without any problem. This applies extremely well to particles smaller than the gap. However in some applications, large particles are present: in drilling, LCM particles usually have a larger size (1 mm of particles or several millimeters of square flakes), while in other applications sand particles may be present. These large particles can create plugging of the cavities between rotor and stator, especially if flow is forced into the machine while the machine is stalled. In this latest condition, the hydraulic machine acts as a particles filter.

A minimal contact between two parts of helical hydraulic machine reduces friction in the rotor-stator pair, the abrasive and erosive deterioration of the surfaces, thus extending the service life of a motor or pump: this minimum gap may be imposed by a rotor guidance system, as explained in later section. Publication on heavy oil production methods [SPE 0059276] also emphasizes that a PCP can achieve high efficiency without "interference fit" between the rotor and stator. For pumping of fluids with a high viscosity (like heavy oil), the design based on "sloppy fit" helps to the preserve the chromed or boronized surface of a rotor. This means that such a screw pump comprising a hard rotor and hard stator exhibits a low mechanical abrasion, low erosion, while keeping the head of pump at desired level. The gap of several tens microns is typically recommended in publication for high-viscosity fluids.

The use of a metal-metal pair (or composite-composite pair) removes the chemical-related problems of elastomer: aging by drilling fluid/production fluid, reaction with gases dissolved ($H_2S$, $CO_2$), sudden decompression of the elastomer material saturated with gases after lifting of device to the surface.

The use of regular design of PCP/PDM often faces the problem of plugging of cavities by sand or loss-circulation materials (LCM) suspended in the fluid. This problem becomes acute with a metal-metal pair (or composite-composite pair) in the hydraulic system. There exists a method to limit and even suppress the plugging effect with a special valve (U.S. Pat. No. 6,371,206, Preventing of Sand Plugging of Oil Well Pumps, 2002). When the well pump is idle and there exists a risk of sedimentation of suspended particulate atop the idle pump, a piece of production tubing is closed by the valve. When this valve is reopened, a sudden pressure variation is created to that remove the accumulated particulates from atop. But this method does not address the problem of particle accumulation inside the pump or aggregation of loss-circulation material inside PDM cavities. It was observed in experiments (such as made in Schlumberger by Demos Pafitis) and others that concentration of LCM can become so high (especially during PDM stalling) that it was impossible to restart the motor after a single motor stalling.

SUMMARY OF THE INVENTION

The object of this invention is to improve the design of positive displacement motors and progressive cavity pumps.

Said object is achieved by using a positive displacement motor comprising a rotor and a stator of helical shape without elastomeric coating or liner installed with a clearance wherein said stator is hard with an elastic modulus of at least 10 times the elastic modulus of elastomers used in stators, further wherein said clearance is 0.05-0.5 mm. Preferably, said rotor and/or stator are additionally covered with a wear-resistant coating. Said motor may comprise multiple sections comprising said rotor and said stator.

Also, said object can be achieved by using a positive displacement motor comprising a rotor and a stator without elastomeric coating or liner installed with a clearance wherein the lobes of said rotor have through channels hydraulically connecting the chambers formed by said lobes. The channels in adjacent lobes are preferably arranged not in line. Preferably, the axis of at least part of said channels is curved. Typically, the diameter of said channels is 2-10 mm. The rotor surface may additionally have grooves of 5-10 mm width and depth of 0.5 to –10 mm depending on operation conditions. Typically, one cavity has at least 2 grooves and one lobe pitch has at least two channels. Said motor may also comprise multiple sections comprising said rotor and said stator.

By design analogy, similar holes and channels could be installed in the stator in hydraulically equivalent position.

Also, the previously described local channels (either in the rotor and stator) could be replaced by a spiral grooves (either in rotor or stator). The groove angular orientation can be either in the same or opposite direction to the component in which one is formed. However, its pitch and the number of grooves should be such that at least one opening is present in the sealing line of each cavity between the stator and rotor. With such a system, the sealing line of each cavity has an opening for any angular position of the rotor: the opening is "apparently" moving axially during the rotor rotation, allowing the cleaning over the whole sealing length after one rotation.

The invention relates to the oil and gas industry, in particularly, to the field of design of helical hydraulic machines. The design of hydraulic machine is offered with a small positive clearance between a solid rotor and solid stator. The size of clearance depends on the properties of fluid transported through the machine. Minimal clearance is also chosen in accordance with process of manufacturing and assembling of the rotor in the stator. Also the minimal clearance is enough for passing of most of small particulates expected in the fluid thus reducing sand plugging, abrasion and erosion caused by particle flow at high velocities. To deal with particles bigger then the clearance a number of special channels through the lobes of either rotor or stator are evenly placed hydraulically connecting adjoining cavities located at both sides of the lobes. The flow goes through the clearance but also passes through those channels flushing the cavities while operation of the motor. Another alternative is to form spiral grooves in the surface of the rotor or stator. The lobe hole allows the flow through the pump of "cubical or spherical" large particles while the surface channels or grooves allows the flow through the pump of "flat" large particles.

In normal operation, most of the flow is passing trough the pump via the rotation of the progressive cavities: only the particles related to the leak rate needs to pass trough the clearance, the lobe holes, channels or spiral grooves.

In stalling mode of a motor operation, the whole flow is becoming a leak trough the system: larger amount of particles needs to be handled via plugging and locking the motor. With limited concentration of large particles, the size of lobes holes, channels or spiral grooves can allow the flow even during stall condition. For large concentration, other means may be required such as a pressure bleed-off valve (installed on a hollow rotor) which allow to by-pass part of the flow outside of the hydraulic motor. Also in normal operating mode, the rotor has some sliding while rolling/rotating effect. Small particles would be compressed and dragged in the area of cavity sealing. As this area is continuously moving and covering the whole periphery after one rotation, wear would be appearing over the whole surface of the rotor and stator. This effect can be prevented or limited by the use of guidance mechanism on the extremity of the hydraulic system to insure no direct contact of the rotor onto the stator.

DETAILED DESCRIPTION OF THE INVENTION INCLUDING EXAMPLES AND DRAWINGS

The current invention presents an improved design of a device described in the Schlumberger. U.S. Pat. No. 6,241, 494 [Demos Pafitis, 2001] claiming a principle of positive clearance for hydraulic motor with non-elastomeric stator. The current invention is based on this Schlumberger's invention as a basic concept for further improvement in design and operation.

Similarly to the basic concept, the stator of the helical machine is made of non-elastomeric material that helps to avoid the problems inherent to conventional elastomeric stators (low strength, high deformation under operational loads, aging, chemical and thermal sensitivity, gas-induced swelling, temperature expansion).

The material for the stator manufacturing is metal, alloys, ceramic, or composite suitable for downhole conditions. The material for the rotor is the same or a hard material with similar temperature expansion coefficient in the operation range.

Now the stator is rigid so that its elastic module is at least 10-100 times higher than in the typical elastomers used for the conventional stators. Special thin coating may be used on the stator (or/and rotor) to enhance their resistance to erosion and wearing.

Since the device according to invention has no elastomeric elements, it can be assembled for operation at high temperatures (>140 degC).

The rotor rotates in the stator with a prescribed and constant clearance rotor-stator. The said clearance is determined to be wider than the 2 . . . 3 size of particles corresponding to the top of particle size distribution in the operational fluid. The preferable clearance interval is from 0.05 mm-0.5 mm.

BRIEF DESCRIPTION OF THE DRAWINGS

A cross-section taken along A-A line is shown in the right side. The top diagram illustrates a positive interference between a solid rotor and elastomer-coated stator (prior art design).

Embodiment 1

Figure 3:
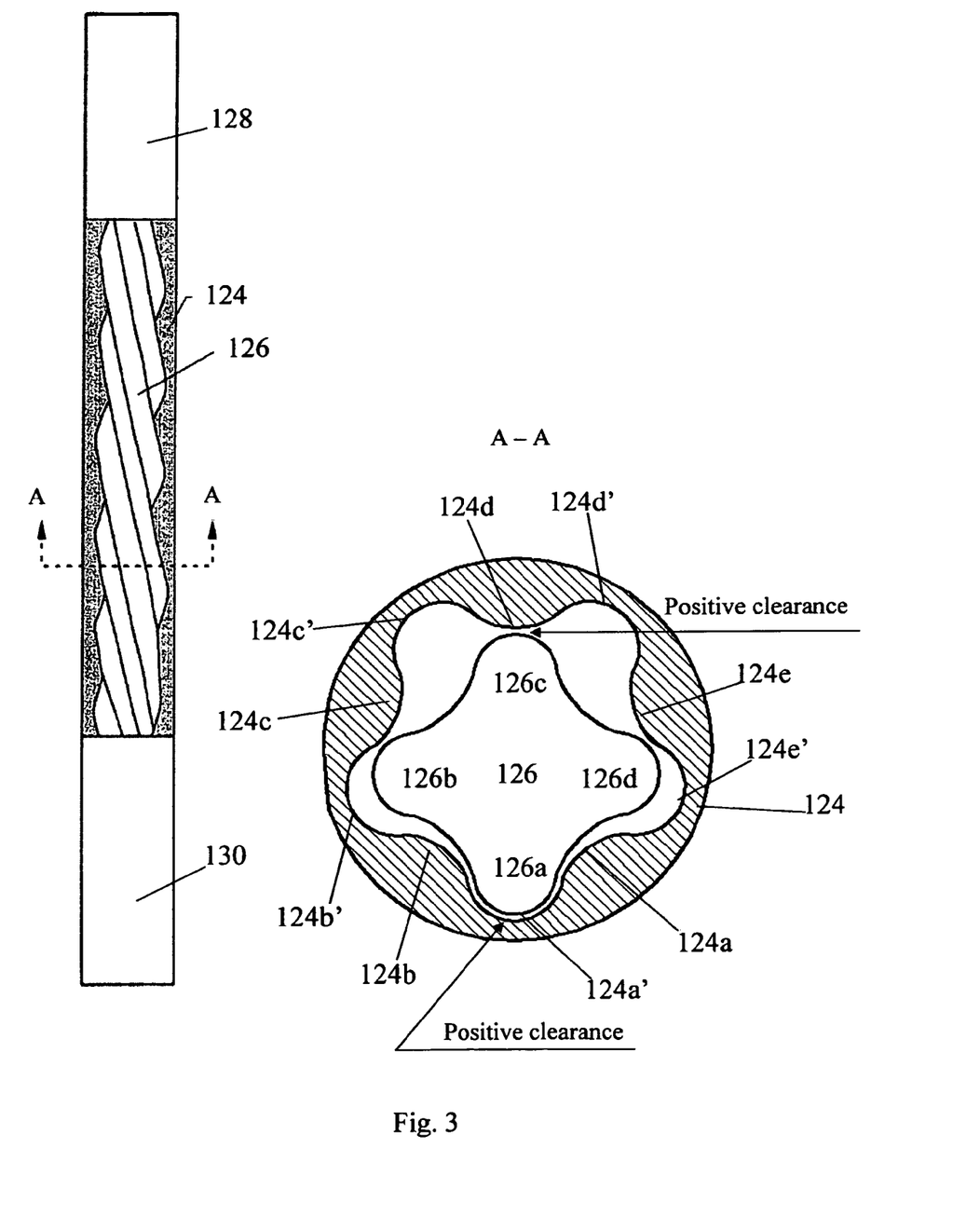
FIG. 3 shows the longitudinal sectional view of a stator-rotor pair according to the invention (left side) and cross-section along the A-A line (embodiment 1).

FIG. 3 shows that at the both ends of the hydraulic machine there are two additional sections 128 and 130. Two support sections at the ends and the hydraulic machine constitute the hydraulic section of the PDM (or, PCP). This section can be the motor (or the pump) itself, but alternatively the downhole unit may comprise multiple sections connected together. This allows one to increase the power while, if said sections are short enough, reducing the cost of each individual section and lowering the negative effect of well curvature by providing flexible connections between said sections. These sections incorporate a special guiding mechanism which ensure consistent rotation and nutation of the rotor 126 inside the stator 124 and provide the support for the rotor 126 so that the rotor does not see contact with the stator within the power section between the sections 128 and 130.

The cross-section in FIG. 3 shows the expected position of the rotor 126 inside the stator 124 with positive clearance along its entire perimeter. This will eliminate the friction and abrasive wearing within the poser section. Also this will decrease the filtering of the small particles since they gap for them will exist on the full round basis.

The guiding mechanism drives the rotations of the rotor so that its rotational speed about its own axis and nutational speed about the axis of the stator are insured to be in the following relation [W. Tiraspolsky, *Hydraulic Downhole Drilling Motors*, Editions Technip, Paris, 1985, p. 246]:

$$n_{nut} = z_2 \cdot n_{rot}.$$

where $z_2$ is the number of lobes of the rotor.

This may be achieved by using a special gear mechanism or simply repeating the geometry of power section but with tight clearance closed to zero.

The guiding mechanism in the special sections 128 and 130 does not contribute to the motor performance and it is specially designed to have enhanced wearing resistance to keep the rotor in right position to the stator within the power section. This may be achieved by protecting the guiding mechanism from the main fluid and its abrasive particles passing through the motor or by use of special material or coating on the wearing surfaces of the guiding mechanism. Tungsten carbide can be used for the guidance system.

If multiple short motor sections are being used, It can be recommended to a guidance systems at the extremity of each short sections.

Embodiment 2

In another embodiment the problem of plugging of the hydraulic machines is addressed by placing additional preferably round holes through the lobes of either the rotor or stator: (see FIG. 4, 5 for holes in rotor). The holes through the adjoining rotor lobes should not be on a straight line to ensure flushing effect (see FIG. 5). The axis of those holes may not be parallel to the axis of the rotor or may be curved allowing good machinability.

Diameter of the holes is large enough to allow the passage of LCM particles (loss circulation material particles) or any other particles bigger then the clearance. The preferred size of transport holes is from 2 to 10 mm. In presence of flake type particles (potential type of LCM), in addition to the holes a set of groves may be made on the surface of rotor (or stator) with typical width of 5 . . . 10 mm and depth 0.5 . . . 2 mm. As the holes the grooves may be evenly distributed along the rotor (or stator) having at least 2 grooves along the length of one helical lobe pitch of the system.

As alternative to these local grooves, spiral grooves can be machines either on the rotor or stator. In practical application, the sealing area is moving on the periphery of the rotor/stator during the rotation of the rotor: each point of the rotor and stator will be covered by the sealing area during one rotation. With the proper pitch of the spiral, a limited number of openings is present in the sealing area for any position of the rotor. The spiral can be forwards of backwards, but its pitch must accordingly adapted. With such a construction, opening in the sealing area is moving axially during the rotor rotation, allowing cleaning of the clearance.

The holes are evenly placed along each lobe of rotor (or stator) so that there are at least 2 holes over the lobes pitch. By such the way with running motor there will always be at least 1 channel connecting adjoining chambers. In the presence of the filtering problem (when the big particles are filtered out by the clearance), it is preferable to pass most of leakage flow through those holes, and a smaller part of the contaminated fluid or drilling mud should be squeezed through the peripheral clearance. To achieve that goal, the holes diameter is determined (based on the large particle size) first and then the number of holes in one rotor lobe per one pitch is determined so that to achieve the summed area of all holes per each cavity to be bigger than the area of the peripheral clearance. Upper limit for the number of holes is determined by overall leaks area and expected motor performance (more area for the leakage means less performance for the motor).

Figure 4:
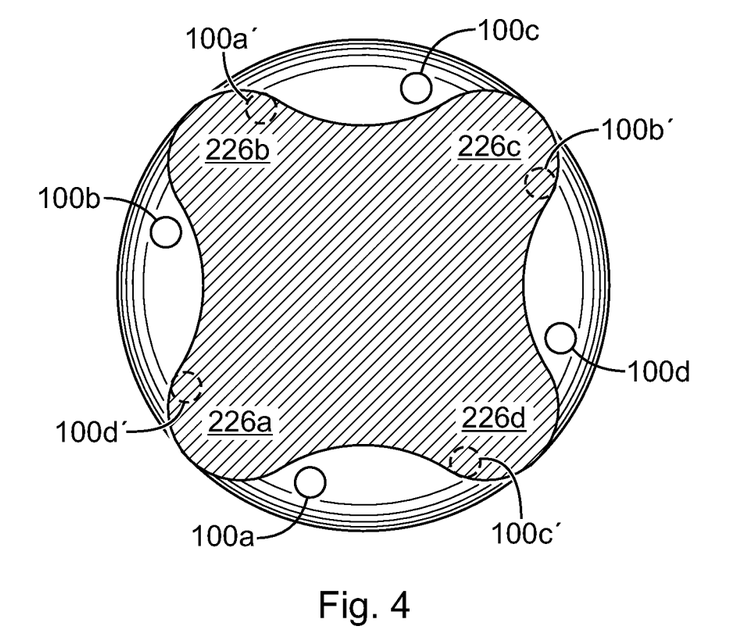
FIG. 4 is the cross-sectional view of a rotor according to invention (embodiment 2) illustrating the allocation of drilled holes in the rotor body.
Figure 5:
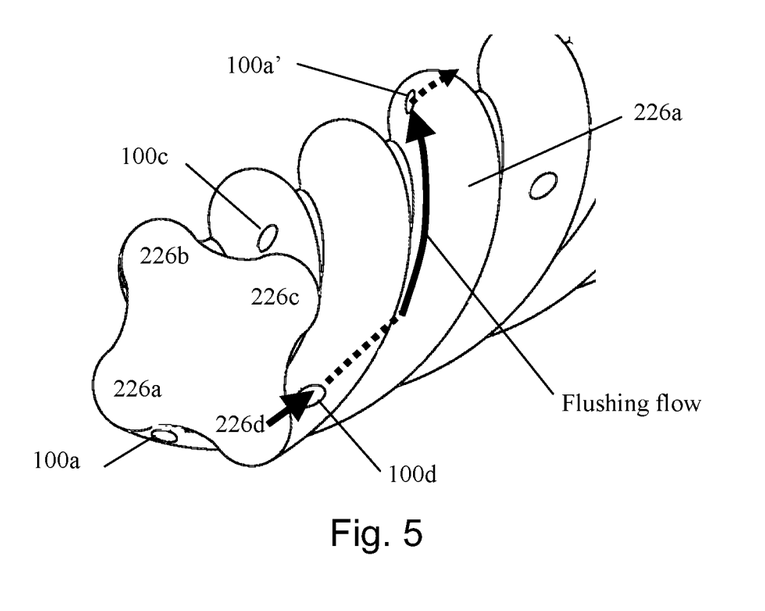
FIG. 5 is a 3D projection of the rotor according to the invention.

An illustration of this concept is shown in the FIG. 4. The hole 100c is drilled through lobe 126c and the hole 100d is drilled through lobe 126d. Relative position (angles $\alpha 1$ and $\alpha 2$) of these holes is the same for each lobe so that the in-hole and out-hole are not on the straight line along the rotor axis. The holes 100d and 100d' are neighboring along the cavity and are located on the same surface of the lobe 126d with helical pitch between them $\alpha 3$ as half of stator pitch. FIG. 5 shows the same holes in 3D picture with expected flow pass flushing the cavity between the lobe 126a and 126d.

This allocation of holes in lobes provides a flushing flow from one cavity to another. Additional holes induce a minor loss in the performance of a hydraulic motor, but allow sustain no-stall (no-plugging) operation in challenging conditions.

Combinations of lobes holes, channels or spiral grooves can insure optimum operation when the fluid has a wide range of particles.

Embodiment 3

The extreme case of flow leakage is for the motor stalled condition: the entire flow has to be forced through the clearance and lobe holes. There is a risk that the clearance is reduced by the large particles as not sweeping action is achieved as there is no rotation. Then flow normally passing trough the clearance is redirected into the lobe holes: this increases the pressure drop across the motor under stalling for a certain time. This may also induce erosion in the lobe holes. An alternative method to limit these effects is to install a pressure limiting valve in the motor: when the pressure across the motor increases above a pre-defined threshold, the valve opens and by-passes part of the flow outside the clearance between rotor and stator. In practical application, this valve can be installed inside the central axial bore of hollow rotor. This installation can be made in a similar fashion as the conventional rotor nozzle used occasionally when motors have to be operated at extremely high flow rate. The valve can be a "conventional" pressure limiting valve such as a ball closed by a spring against the pressure. When such a pressure limiting valve is installed in the rotor by-pass central hole, it is directly submitted to the differential pressure across the motor.

A combination of the first two said embodiments can be employed. The guidance systems are installed to reallocate the friction and abrasive milling from rotor-stator pair to the guidance system and provide passage of fine particles through a constant-width clearance. The holes in the lobe (rotor or stator) body ensure flushing for bigger particles while channels and/or spiral grooves ensure flushing for flat particles.

Finally the third embodiment can be added to the previous combinations to allow proper behavior during motor stalled condition, while the fluid contains a large amount of large and/or flat particles. In that case, a certain amount of flow is by-passed out of the cavities between rotor and stator.

The new design may be constructed by incorporating the guiding mechanism or the flushing channels or the by-pass valve system separately or as a combination of the three solutions in one design. In any version there will be the full range of the above mentioned advantages due to the use of non-elastomeric stator that will increase the reliability of the tool.

Example 1

To estimate efficiency of a motor with these additional channels in the body of rotor, let us consider the motor to be of the same type and size as the working prototype described in the U.S. Pat. No. 6,241,494. In that case the stator's OD was 6.75 inches (172 mm) and stator pitch was 27.8 inches (706 mm). Estimation of leakage flow areas through the clearances of 0.3 mm is 212 mm$^2$.

Figure 6:
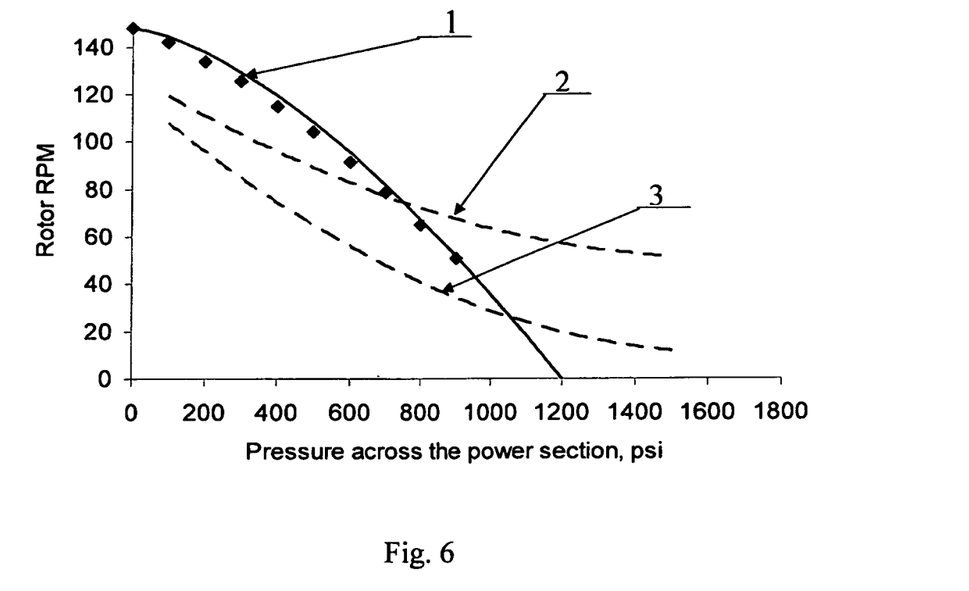
FIG. 6 is a typical operational curves for a prior art motor (elastomeric stator with positive interference depicted in FIG. 1) as well as d for solid rotor-solid stator pair with a fixed gap.
Figure 7:
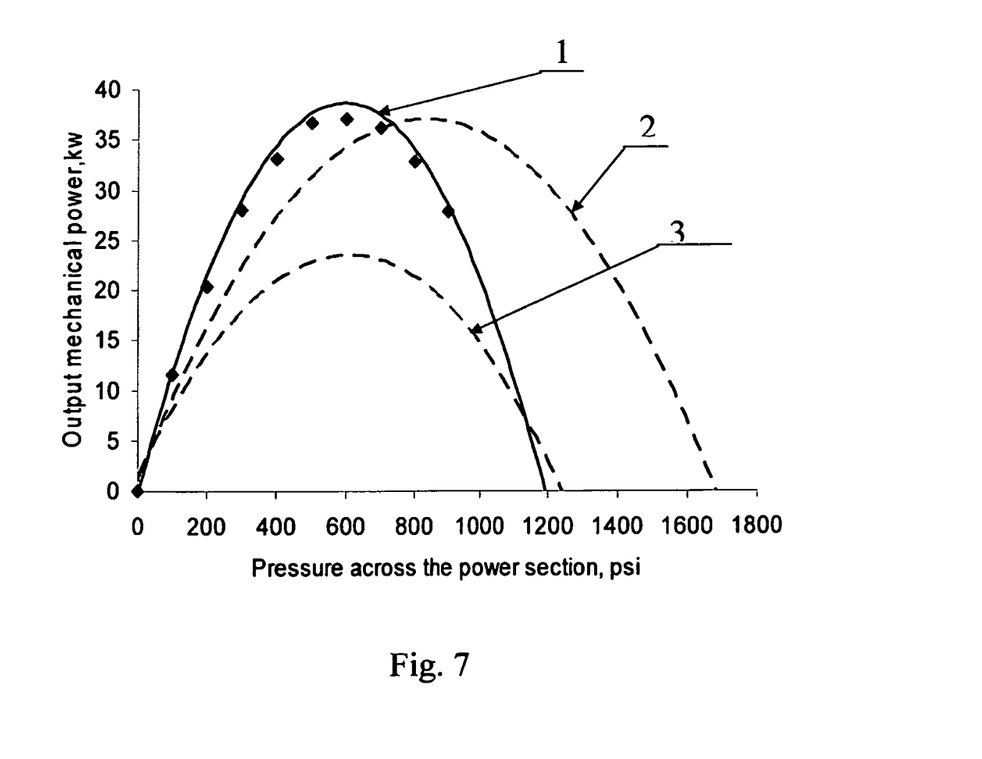
FIG. 7 is a typical mechanical power curve as a function of pressure drop across the power section for prior art motor (elastomeric stator with positive interference) and a motor according to the invention (solid rotor-solid stator pair with a fixed gap).

If the size of the big particles is 4-6 mm, the disclosed device may have 2 holes of 8.5 mm in diameter per each cavity: this gives additional area of 113 mm$^2$ that is about a half of leakage area in the working original prototype. Thus putting away secondary hydrodynamic effects, to achieve approximately the same performance as the prototype was, the new design must have clearance of 0.15 mm (a half of prototype clearance). The area of the clearance will constitute 106 mm$^2$ (i.e., less than the holes area) and most of leaks will go through the holes that will help to avoid the plugging problem. If the size of the big particles is only 1-2 mm the, new design may have 16 holes of 3 mm in diameter per each cavity to achieve the same performance and flushing effects at the same clearance 0.15 mm between the solid rotor and solid stator. FIG. 6 and FIG. 7 illustrate the comparison of theoretically expected performance of new design versus conventional design of a PDM with elastomeric stator. Points on the graphs represent typical data for motor (such as SLB Power-Pak A675SP4548 with normal interference fit 0.016 inches). That is a conventional PDM motor with elastomeric stator. The solid curves 1 are the curves approximating the experimental points of the conventional motor. The dashed theoretical curves 2 and 3 represent the estimations for a hydraulic motor with 2 channels of 8 mm in diameter per each cavity and the clearance 0.1 mm and 0.2 mm. All the curves are plotted for the same and constant flow rate 300 gal/min (0.02 $m^3$/sec). Although the numbers on the graphs correspond to a particular motor, the shape of the curves is similar to that for all types of conventional hydraulic motors [PowerPack Steerable Motor Handbook, Schlumberger, 2004, page 99-192].

In FIG. 6 the RPM curve of the conventional motor drops significantly: this reflects the fact of widening a gap because of deformation in the elastomeric coating (linear model of gap growth had been used to best fit the experiments). Since the new design of the device according to the invention has a fixed clearance (both stator and rotor are made solid), the leakage occurs by a different law. There exists a point where the leakages in the constant-gap design become even less than for a motor with elastomeric stator (prior art) at the same pressure drop per power stage.

FIG. 7 shows the calculated performance of new design in terms of useful mechanical power. The effectiveness declines with the increase in the clearance, but there is an interval of pressure drop (high pressure drop), where the disclosed device is more efficient (the gap is smaller than for a motor with elastomer-covered stator). Considering the clearance of 0.1 mm, the curve says that the expected maximum power will stay as it was in conventional motor but stalling torque is expected to be 40% higher, so that the new motor will be able to operate in more aggressive drilling regime. With clearance of 0.2 mm there will always be the less power within the same range of operation but the range and the power may be increased simply by increasing the flow rate.

Thus FIG. 6 and FIG. 7 demonstrate that the disclosed device is less effective in operation at low differential pressure but will better fit aggressive drilling conditions when high torque is required in the same size of the tool.

The conclusions about lower friction, plugging resistance, temperature durability, and longer service time are valid not only for a progressive cavity motor illustrated in the example, but also for a progressive cavity pump with a non-elastomeric stator.

Figure 8:
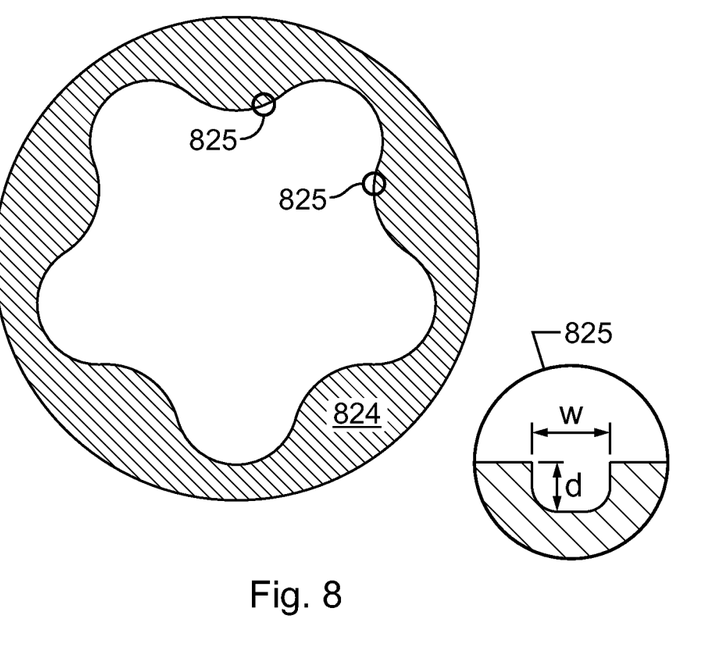
FIG. 8 is a cross-sectional view of a stator that includes a groove.

As mentioned, either the rotor surface or the stator surface may additionally have grooves 5-10 mm wide and 0.5-10 mm deep depending on product operation conditions. FIG. 8 shows a cross-sectional view of a stator 824 that includes a groove 825 that may be defined by a width (w) and a depth (d).

Figure 9:
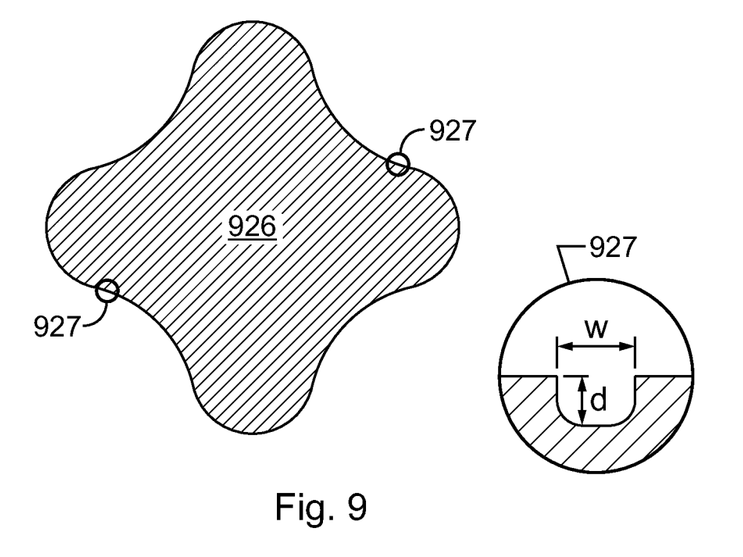
FIG. 9 is a cross-sectional view of a rotor that includes a groove.

FIG. 9 shows a cross-sectional view of a rotor 926 that includes a groove 927 that may be defined by a width (w) and a depth (d).

What is claimed is a:

1. A progressive cavity hydraulic machine comprising a multi-lobe rotor and a stator of helical shape without elastomeric coating installed with a clearance wherein said stator is a hard metal, alloy, ceramic or composite material wherein said clearance is 0.05 mm to 0.5 mm, and wherein the rotor surface or the stator surface comprises a groove wherein dimensions the groove comprise a width of 5 mm to 10 mm and a depth of 0.05 mm to 10 mm.

2. A progressive cavity hydraulic machine according to claim 1, wherein said rotor and/or stator are additionally covered with a wear-resistant coating.

3. A progressive cavity hydraulic machine according to claim 1, wherein said machine comprises multiple sections.

4. A progressive cavity hydraulic machine of claim 1 wherein the lobes of said rotor or stator comprise through channels hydraulically connecting chambers defined by said lobes.

5. A progressive cavity hydraulic machine according to claim 4, wherein the channels in adjacent lobes are preferably arranged not in line.

6. A progressive cavity hydraulic machine according to claim 4, wherein the diameter of said channels is 2 mm to 10 mm.

7. A progressive cavity hydraulic machine according to claim 1, comprising at least 2 grooves.

8. A progressive cavity hydraulic machine according to claim 1 wherein the groove has a spiral pattern around a rotational axis of the rotor.

9. A progressive cavity hydraulic machine comprising:
    a stator; and
    a rotor that comprises lobes wherein at least one lobe comprises openings and a through channel that hydraulically connect a first chamber defined between the rotor and the stator and a second chamber defined between the rotor and the stator, wherein the through channel comprises an axis and wherein the axis is curved.

10. The progressive cavity hydraulic machine of claim 9 wherein the through channel comprises a diameter of 2 mm to 10 mm.

11. The progressive cavity hydraulic machine of claim 9 wherein a first lobe of the lobes comprises the through channel as a first through channel and wherein a second lobe of the lobes comprises a second through channel.

12. The progressive cavity hydraulic machine of claim 9 without an elastomeric coating.

* * * * *